(12) United States Patent
Balcazar et al.

(10) Patent No.: US 8,008,922 B2
(45) Date of Patent: Aug. 30, 2011

(54) BALLAST AND WIRING LAMP FIXTURE TESTER

(75) Inventors: Jesus Ortiz Balcazar, Ciudad Camargo (MX); Leonel Garcia Chavez, Ciudad Camargo (MX)

(73) Assignee: Leviton Manufacturing Co., Inc., Melville, NY (US)

( * ) Notice: Subject to any disclaimer, the term of this patent is extended or adjusted under 35 U.S.C. 154(b) by 181 days.

(21) Appl. No.: 12/390,607

(22) Filed: Feb. 23, 2009

(65) Prior Publication Data

US 2010/0213962 A1   Aug. 26, 2010

(51) Int. Cl.
*G01R 31/00* (2006.01)
(52) U.S. Cl. .................. 324/414; 324/403; 324/555
(58) Field of Classification Search .............. None
See application file for complete search history.

(56) References Cited

U.S. PATENT DOCUMENTS

| | | | |
|---|---|---|---|
| 2,630,551 A | 3/1953 | Starbuck | |
| 3,594,636 A | 7/1971 | Gibbs | |
| 4,617,519 A * | 10/1986 | Rosenthal | 324/414 |
| 5,047,721 A * | 9/1991 | Farley | 324/414 |
| 6,097,191 A * | 8/2000 | Jones, Jr. | 324/414 |
| 7,064,554 B2 * | 6/2006 | Moore | 324/555 |

* cited by examiner

*Primary Examiner* — Vinh P Nguyen
(74) *Attorney, Agent, or Firm* — Weiss & Arons, LLP

(57) ABSTRACT

Apparatus and methods for testing a light fixture power circuit are therefore provided. The light fixture power circuit may energize a fluorescent lamp by providing power at first and second power terminals. The lamp holder may include a lamp pin guide for guiding the tube's contact pins toward the first and second power terminals. The apparatus may have probes that simulate the tube's contact pins. The probes may be robotically inserted into the lamp holder in a manner that is similar to the manner in which the contact pins would be inserted. This may eliminate the requirement to use fluorescent tubes to test the light fixture power circuit. The apparatus may include circuitry for testing the impedance of the light fixture power circuit at the first and second power contacts.

17 Claims, 15 Drawing Sheets

US 8,008,922 B2

BALLAST AND WIRING LAMP FIXTURE TESTER

BACKGROUND

Fluorescent tube fixtures typically include an enclosure that supports lamp holders, a ballast and wires. The lamp holders support one or more fluorescent lamps. The ballast and wires feed power to the lamps. A typical enclosure is an elongated sheet metal enclosure designed to accommodate one or more fluorescent lamps.

A light fixture manufacturer may assemble a fixture. The manufacturer may test the fixture, when it is complete or nearly complete, to make sure the wiring is correctly connected and the ballast operates correctly. One typical test is a lamp illumination test. The lamp illumination test involves installing a lamp and turning on the fixture power to make sure that the lamp illuminates. This can be a time consuming process, especially because the test requires installation and removal of one or more lamps for each fixture. Also, the test is not reliable, because even a miswired fixture can cause a lamp to illuminate.

Other tests involve testing fixture circuit continuity or impedance. Typical continuity or impedance tests involve inserting probes into test holes in a lamp holder. The probes include electrodes that are brought into contact with power supply terminals inside the lamp holders after entering the holes. The shapes, sizes, orientations and placement of the holes, however vary among lamp models, so it is necessary for a fixture manufacturer to obtain or fabricate probes for each lamp model.

It would be desirable, therefore, to provide apparatus and methods for efficiently testing fluorescent tube fixtures.

It also would be desirable, therefore, to provide apparatus and methods for reliably testing fluorescent tube fixtures.

It also would be desirable, therefore, to provide apparatus and methods for testing different models of fluorescent tube fixtures.

SUMMARY

It is an object of the invention to provide apparatus and methods for efficiently testing fluorescent tube fixtures.

It is another object of the invention to provide apparatus and methods for reliably testing fluorescent tube fixtures.

It is yet another object of the invention to provide apparatus and methods for testing different models of fluorescent tube fixtures.

Apparatus and methods for testing a light fixture power circuit are therefore provided. The light fixture power circuit may energize a fluorescent lamp by providing power at first and/or second power terminals. The lamp holder may include a lamp pin guide for guiding the tube's contact pins toward the first and second power terminals. The apparatus may have probes that simulate the tube's contact pins. The probes may be robotically inserted into the lamp holder in a manner that is similar to the manner in which the contact pins would be inserted manually. This may eliminate the requirement to use fluorescent tubes to test the light fixture power circuit. The apparatus may include circuitry for testing the impedance of the light fixture power circuit at the first and second power contacts.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF EMBODIMENTS

Figure 1:
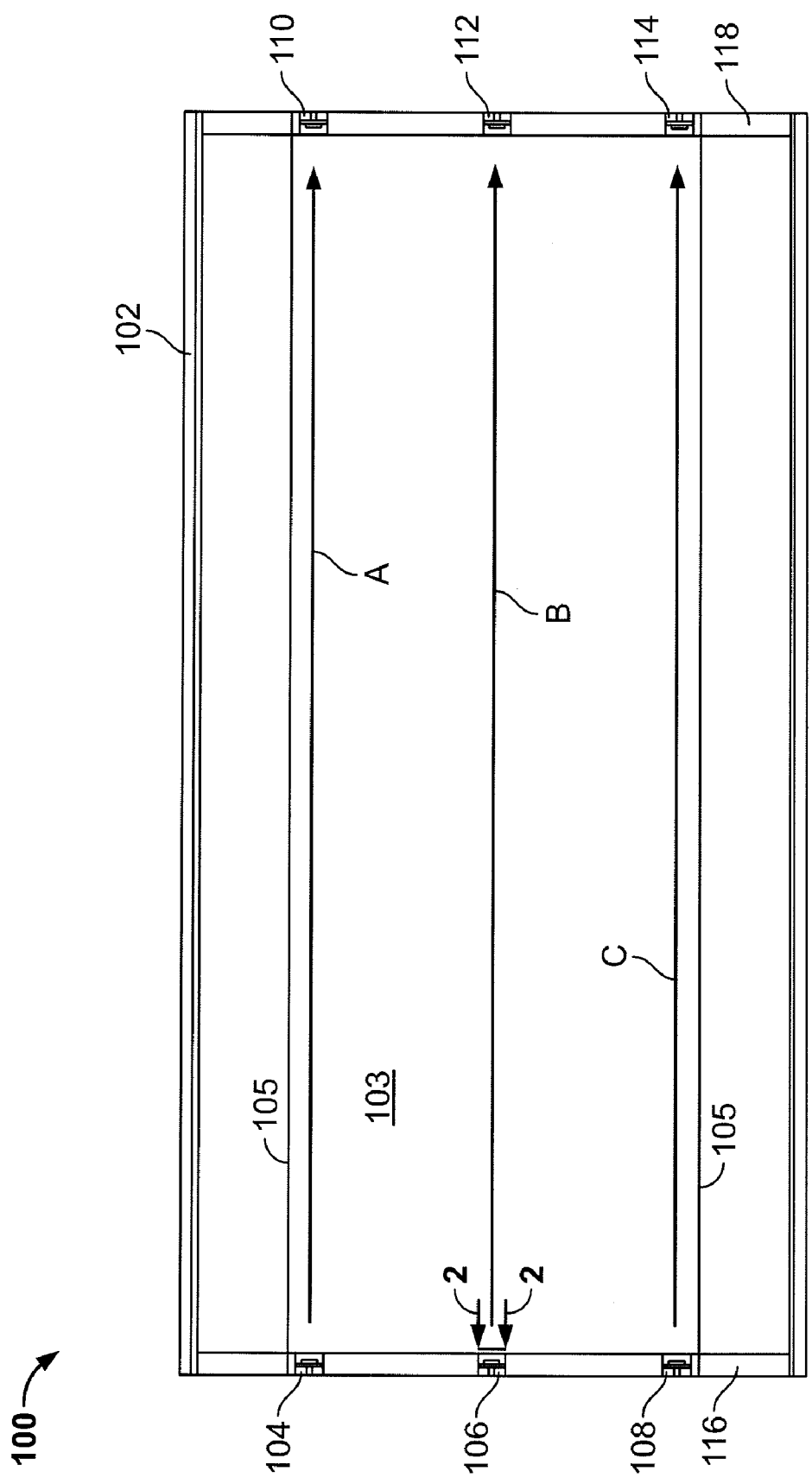
FIG. 1 shows a work piece that may be used in accordance with the principles of the invention.

Apparatus and methods for testing a light fixture power circuit are provided. The light fixture power circuit may include a lamp holder of a type that includes first and second power terminals for supplying power to a fluorescent tube. The lamp holder may also include a lamp pin guide for guiding the tube's contact pins toward the first and second power terminals.

The apparatus may have test probes that simulate the tube's contact pins. The test probes may be mechanically inserted into the lamp holder in a manner that is similar to the manner in which the contact pins would be inserted. This may eliminate the requirement to use actual fluorescent tubes to test the light fixture power circuit.

The apparatus may include mechanical elements that insert the test probes. The apparatus may include a test circuit that energizes the test probes to test the impedance of the light fixture power circuit at the first and second power contacts.

The apparatus may include a rotatable member for supporting the test probes such that the tips extend away from the rotatable member. The rotatable member may include an axis of rotation about which the rotatable member may rotate. The probes may extend away from the rotatable member in an orientation that is substantially parallel to the axis. When the rotatable member rotates, the probes move about the axis in a motion that is similar to the motion involved in installing a fluorescent tube in the lamp holder.

The apparatus may include a rotation actuator for rotating the rotatable member about the axis such that, when the test probes are received by the lamp pin guide (on the lamp holder), the probes move, about the axis, in the lamp pin guide. The test probes may move in the lamp pin guide at least until the tips are in electrical communication with the lamp holder power contacts.

In some embodiments, the rotatable member may be supported by a housing that includes a nest for receiving a portion of the lamp holder.

In some embodiments, the rotatable member may be robotically controlled to engage a lamp holder, perform a light fixture power circuit test, and disengage from the lamp holder. A programmable logic controller may be used to coordinate the motions of the rotatable member, excitation of the light fixture power circuit, communication and display of test results, and conveyance of light fixtures to, and away from, a test area.

The apparatus may include a data storage device in communication with the programmable logic controller. The memory may receive data from the programmable logic controller. The data may relate to a light fixture, a light fixture power circuit, power circuit test results and any other suitable information. The programmable logic controller may be used to retrieve data from the storage device. The programmable logic controller may output the data to a display or to any suitable external device. The data may be output as a report in any suitable format. The external device may be connected to the programmable logic controller using any suitable wired or wireless communication apparatus, including any suitable cables and connectors.

In some embodiments, a bar code reader may be provided. The bar code reader may be in communication with the programmable logic controller via any suitable wired or wireless apparatus. Any suitable bar code reader device driver and/or interface may be used to provide data communication between the bar code reader and the programmable logic controller. The bar code reader may be stationed to read a bar code affixed to the light fixture. The bar code may be encoded to provide to the programmable logic controller information about the light fixture, the power circuits or any other suitable information. The information may include parameters for testing the light switch power circuit. The parameters may include current and voltage amounts, test cycle time constants, number of test repetitions, pass criteria and any other suitable parameters.

In some embodiments, the tester may include a power source for powering a light fixture ballast. Different models of light fixtures may have different model ballasts. The different model ballasts may require different amounts of power. The tester may supply the appropriate amount of power to the ballast during testing. In some embodiments, the appropriate amount of power for the ballast may be determined by a user. In some embodiments, the ballast power amount may be read from a bar code on the light fixture.

In some embodiments, the data storage device may be provided with a table that associates test parameters with light fixture information, such as model number. The programmable logic controller may then perform a test that is designed for each light fixture model.

FIGS. 1-11 show illustrative embodiments and features of the invention.

FIG. 1 shows illustrative light fixture 100, which may be tested by embodiments of the invention. Light fixture 100 may include enclosure 102. Surface 103 of enclosure 102 may be a reflector. Surface 103 may have breaks in slope 105 to direct light in selected directions. Light fixture 100 may include lamp holders 104, 106 and 108. Lamp holders 104, 106 and 108 may each hold one end of a tube-type fluorescent lamp. The other end of each lamp may be held by lamp holders 110, 112 and 114, respectively. Arrows A, B and C show where fluorescent tubes would be placed between corresponding lamp holders.

The lamp holders may be fixed directly to enclosure 102. The lamp holders may be supported by a support member. For example, lamp holders 104, 106 and 108 may be supported by lamp holder support 116. Lamp holders 110, 112 and 114 may be supported by lamp holder support 118. Lamp holder supports 116 and 118 may be detachable from enclosure 102. In some embodiments of the invention, a lamp holder support may be used to insert a portion of one or more lamp holders into a light fixture power circuit test device.

Figure 2:
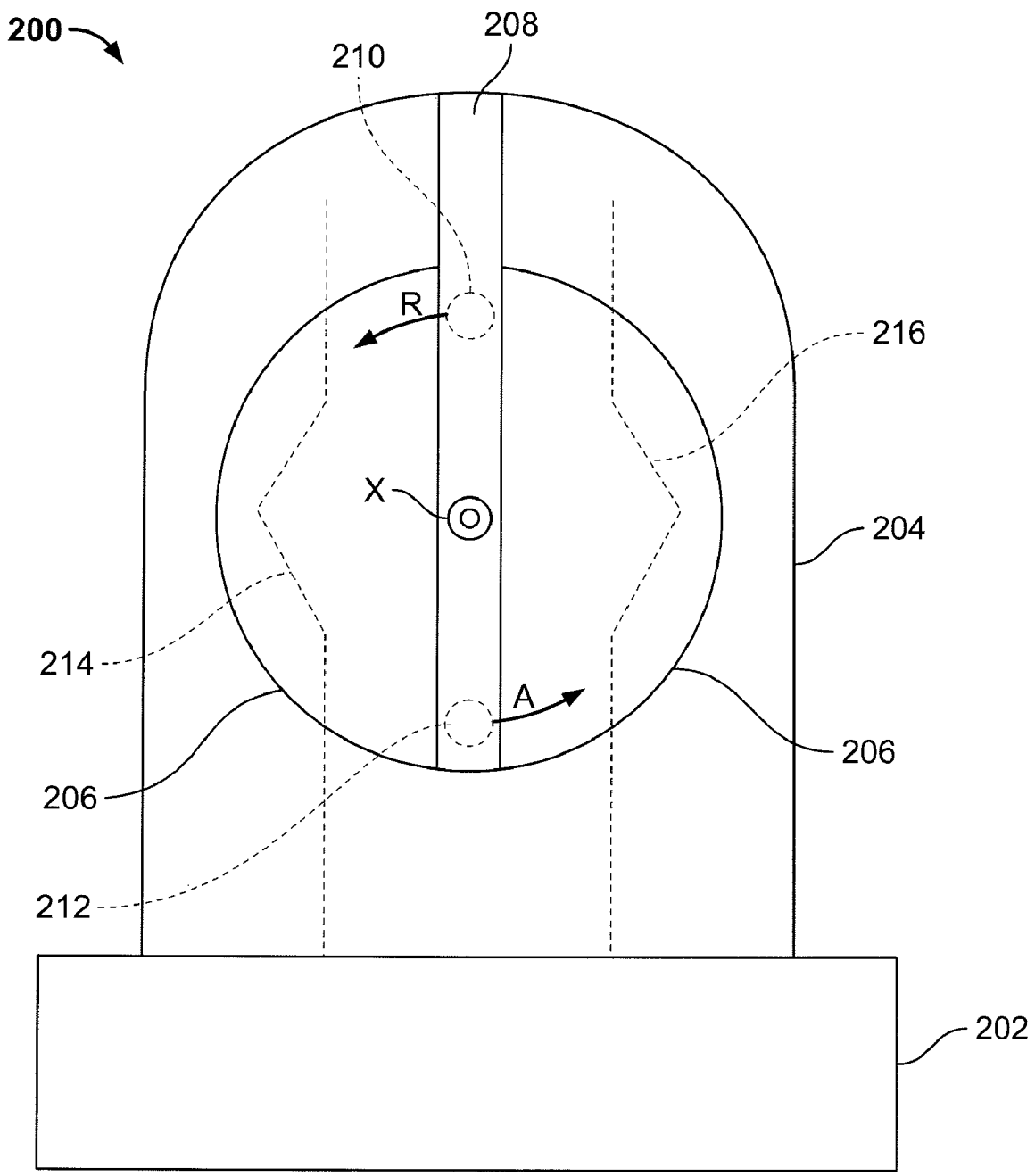
FIG. 2 shows a view of a portion of the work piece shown in FIG. 1 taken along lines 2-2, shown in FIG. 1.

FIG. 2 shows illustrative lamp holder 200. Lamp holder 200 may include base 202, body 204, lamp pin guide 206 and pin slot 208. Paired contact pins from a fluorescent lamp may be inserted into slot 208 until the pins occupy positions 210 and 212. The pins may then be rotated in direction A about rotational axis X until the pins contact power terminals 214 and 216 (shown in broken line) inside body 204 of lamp holder 200. Although in lamp holder 200, pin guide 206 rotates in direction A, embodiments of the invention may test fixtures that have any suitable type of pin guide. For example, in some lamp holders, a pin guide may include only an open area or a track through which the lamp contact pins move about an axis such as axis X.

Figure 3:
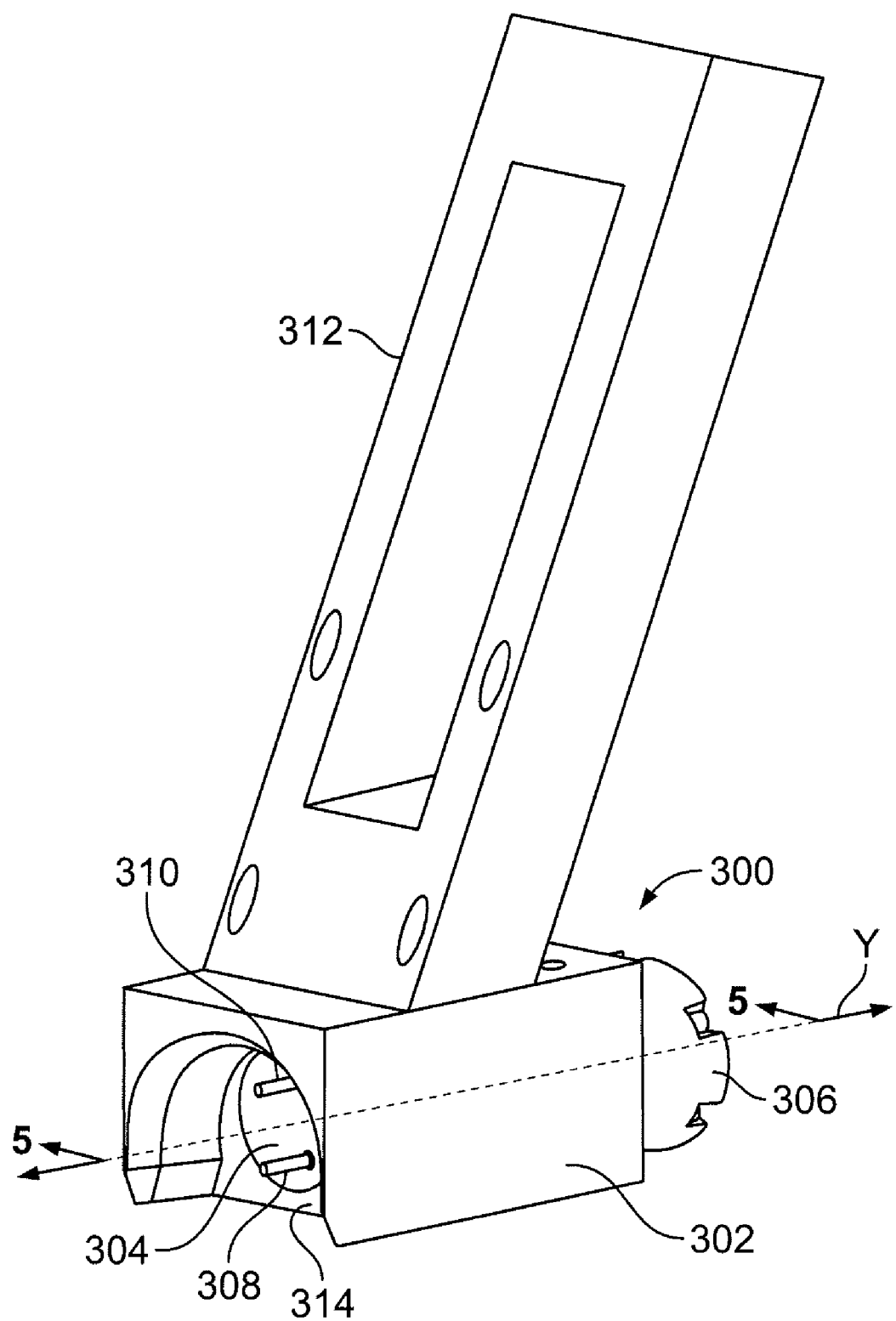
FIG. 3 shows apparatus in accordance with the principles of the invention.

FIG. 3 shows illustrative test head 300. Test head 300 may include housing 302, rotatable member 304 and rotation actuator 306. Probes 308 and 310 may extend away from rotatable member 304 in a direction that is substantially parallel to rotational axis Y. Rotatable member 304 may be rotated by rotation actuator 306. Rotation actuator 306 may be an electromagnetically driven device such as a motor or an angular displacement actuator. Actuator 306 may be controlled via wired or wireless signals. Housing 302 may include nest 314 for seating a portion of a lamp holder such as 200. When lamp holder 200 is seated in nest 314, rotational axes X and Y (shown in FIG. 2) become substantially coincident. When lamp holder 200 is seated in nest 314 and rotational axes X and Y are substantially coincident, probes 308 and 310 can rotate effectively within lamp pin guide 206 to make contact with power terminals 214 and 216.

Test head 300 may be supported by arm 312 or by any suitable test head support structure. The test head support structure may be static or dynamic. Dynamic test head supports may undergo any suitable type of motion. For example, a dynamic test head may translate, reciprocate, rotate, swing or undergo any other suitable type of motion. The motion of the test head support structure may be controlled by any suitable actuator.

Figure 4:
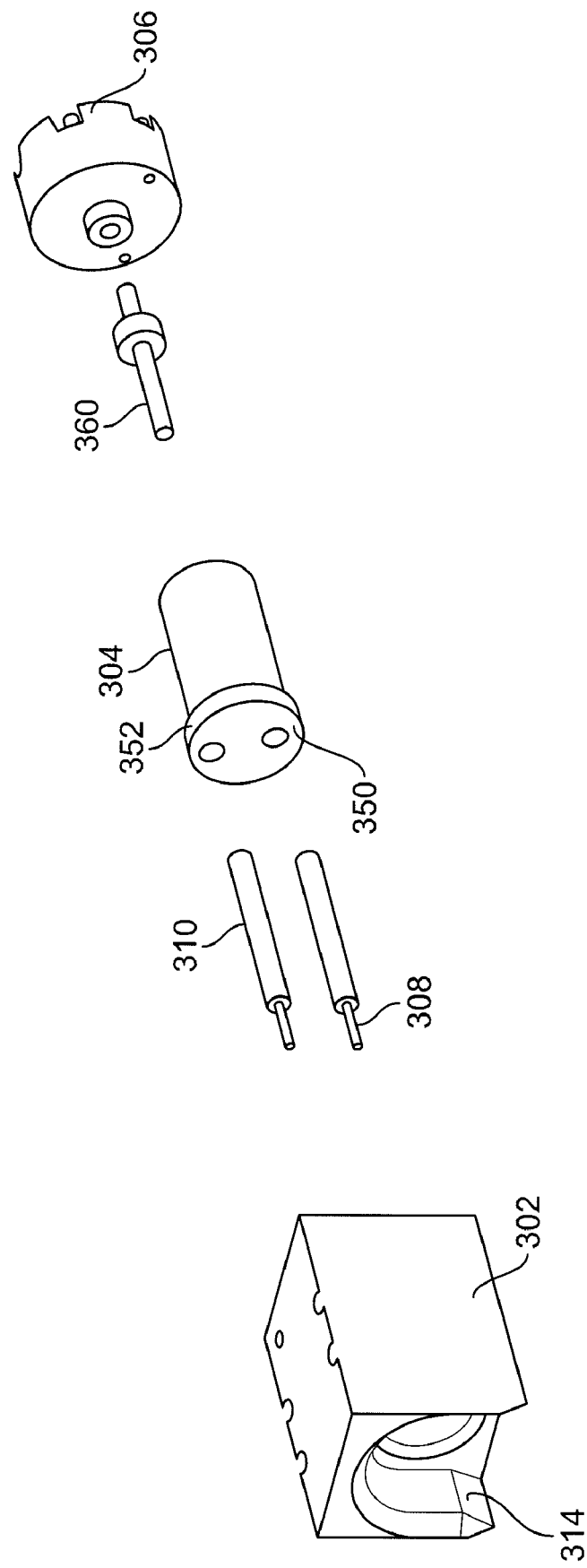
FIG. 4 is an exploded view of a portion of the apparatus shown in FIG. 3.

FIG. 4 shows an exploded view of test head 300. Probes 308 and 310 may be seated in bores 350 and 352, respectively, in rotating member 304. Probes 308 and 310 may be wired to the test circuit external, internally through arm 312 or by any other suitable approach. Rotating member 304 may be driven by axle 360, which may be driven by rotation actuator 306.

Figure 5:
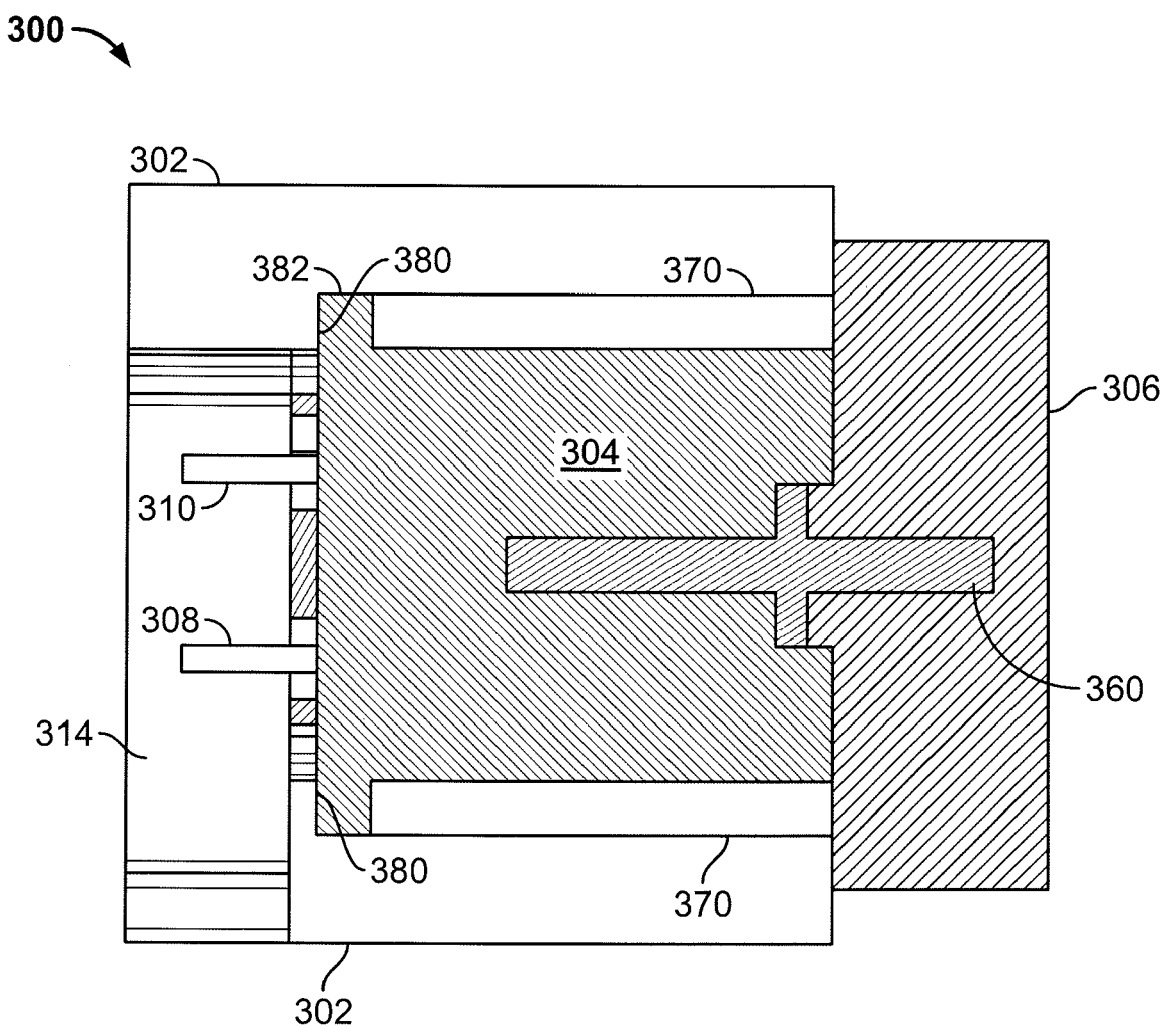
FIG. 5 is a partial cross section taken along direction 5-5, shown in FIG. 3.

FIG. 5 shows a partial cross-sectional view through test head 302 along lines 5-5 (shown in FIG. 3). Rotation member 304 may be supported by bearings 370. Rotation member 304 may be rotated by axle 360. Axle 360 may be driven by rotation actuator 306. A lamp holder may be received by nest 314. Housing 302 may include flange 380 for buttressing head 382 of rotation member 304.

In some embodiments, the apparatus for testing a light fixture power circuit may perform a test with some human intervention in the test. Those apparatus may be referred to as "semi-automatic." In some embodiments, the apparatus for testing a light fixture power circuit may perform a test with virtually no human intervention in the test. Those apparatus may be referred to as "automatic."

Figure 6:
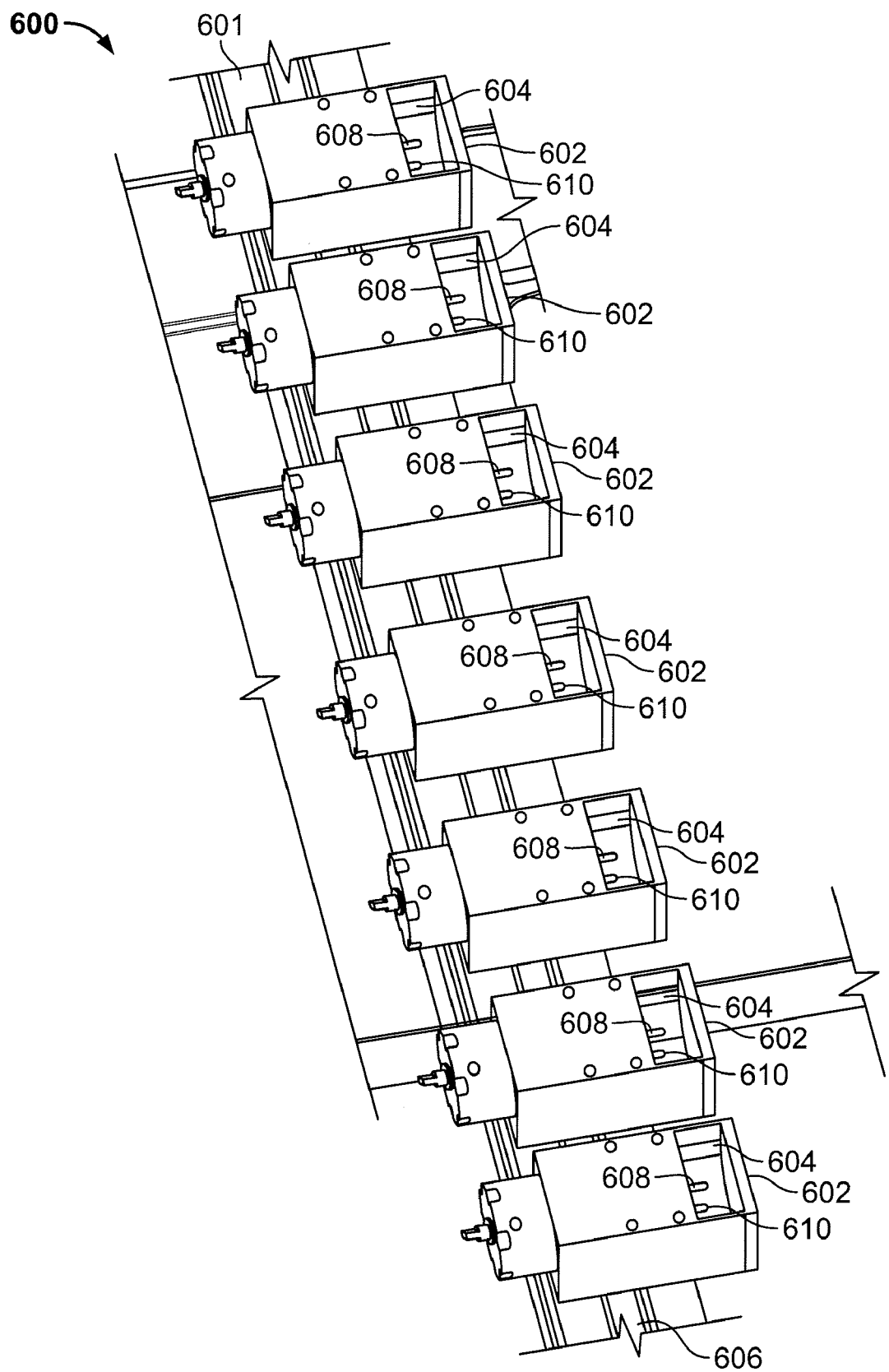
FIG. 6 shows other apparatus in accordance with the principles of the invention.

FIG. 6 shows illustrative arrangement 600 of test heads 602. In some embodiments, arrangement 600 may provide semiautomatic testing of light fixture power circuits. Test heads 602 may have some or all of the features of test head 302. Test heads 602 are mounted on support 601. Each of test heads 602 includes a nest 604 for receiving a portion of a lamp holder to be tested. Each of test heads 602 includes probes 608 and 610 that extend from a rotation member (not shown) into the test head's nest 604.

Support 601 may include track 606 for engagement of test heads 602. The positions and number of test heads 602 on support 601 may be selected to match the positions and number of test heads in a fixture to be tested. Different models of light fixtures, therefore, can be tested.

Figure 7:
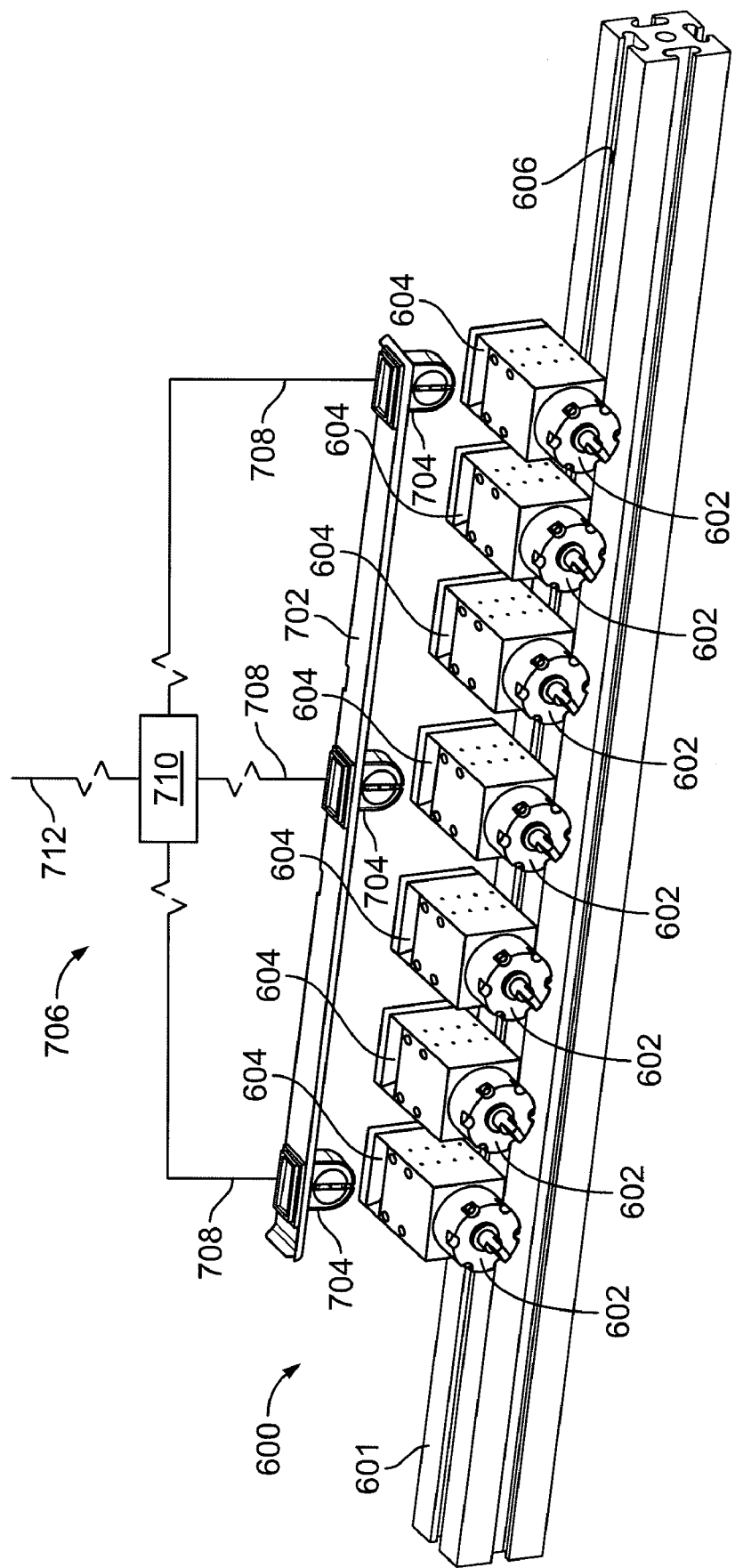
FIG. 7 shows the apparatus shown in FIG. 6 along with a work piece.

FIG. 7 shows arrangement 600 of test heads along with lamp holder support 702. Lamp holder support 702 supports lamp holders 704, each of which has a test nest 604. In the scenario illustrated in FIG. 7, there are only three lamp holders. Each of the lamp holders is to be at least partially inserted into a corresponding nest 604. In some embodiments of the invention, lamp holder support 702 may be manipulated by a human being to insert lamp holders 704 into nests 604. After insertion of lamp holders 704 into nests 604, a test signal may be applied to probes 608 and 610 (not shown in FIG. 7).

The test signal may perform a test on light fixture power circuit 706. Power circuit 706 may include leads 708. Leads 708 may be in communication with power conditioning circuit 710. Power conditioning circuit 710 may include a ballast. Wire harness 712 may include conductors that supply power to power conditioning circuit 710. Wire harness 712 may include conductors that distribute power to lamp holders (not shown) that correspond to lamp holders 704 and are designated for holding the ends of fluorescent tubes that are opposite the ends to be held by lamp holders 704.

Figure 8:
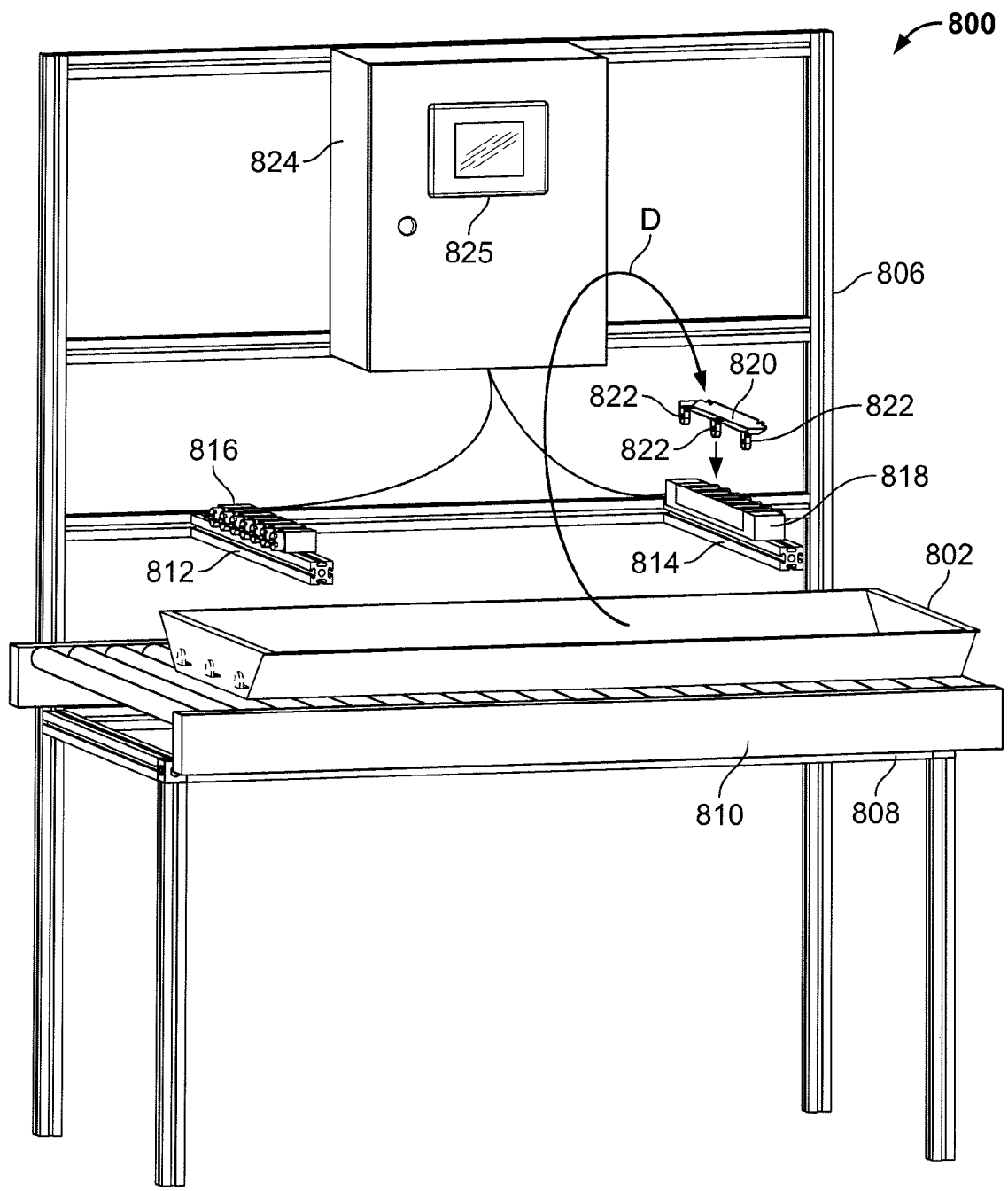
FIG. 8 shows another apparatus in accordance with the principles of the invention along with a work piece.

FIG. 8 shows illustrative test apparatus 800 for testing a light fixture such as fixture 802. Test apparatus 800 may include frame 806. Frame 806 may include bench 808. Bench 808 may support a conveyor such as conveyor 810. The conveyor may include passive components, such as rollers. The conveyor may include active components, such as a motor-driven belt. Struts 812 and 814 may extend from frame 806. Struts 812 and 814 may support test head arrangements 816 and 818, respectively.

In some embodiments, a test may be performed before a light fixture is completely assembled. Arrow D shows that a lamp holder support such as 820 may be lifted from fixture 802. Support 820 may be inverted over test head assembly 818. Lamp holders 822 may then be inserted into the nests of corresponding test heads in test head assembly 818. Apparatus 800 may include test module 824, which may include test circuitry (not shown). The test circuitry may test continuity. The test circuitry may test impedance. The test circuitry may include a comparison circuit for comparing a measured impedance to a reference impedance. The comparison circuit may include a comparator. Circuits and software for measuring impedance, comparing a measured impedance to a reference impedance or value and for outputting a measurement result are well known.

The test circuitry may include output ports for outputting test results to a device. The device may be a display such as display 825. Display 825 may indicate the presence or absence of continuity of a fixture under test. Display 825 may indicate an impedance value of the fixture. Display 825 may indicate whether the impedance value passed or failed a test based on a comparison with a reference impedance signal or a reference impedance value After fixture 802 is tested, it may be conveyed along conveyor 810. Then, another fixture (not shown) may be conveyed into position for testing by apparatus 800.

Figure 9:
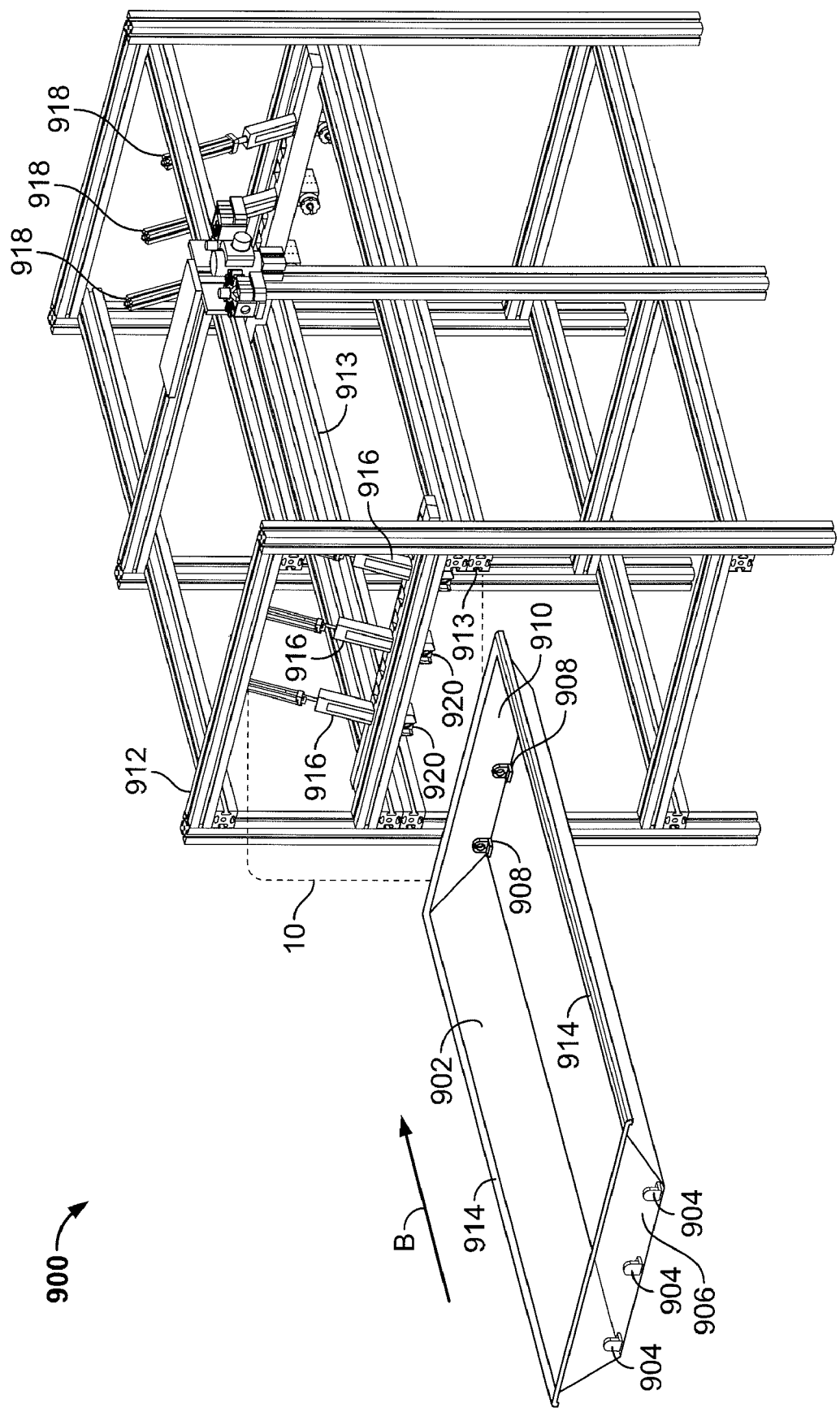
FIG. 9 shows yet another apparatus in accordance with the principles of the invention along with a work piece.

FIG. 9 shows illustrative tester 900. Tester 900 may provide automatic or semiautomatic testing of light fixture power circuits such as a power circuit of fixture 902. Tester 900 may be part of a linear testing or assembly line in which light fixtures are conveyed to and from tester 900 on a conveyor. Light fixture 902 may include lamp holders 904 (shown in broken line, because they are behind panel 906). Corresponding lamp holders 908 (two of three are shown) are present adjacent panel 910, which is opposite panel 906. Lamp holders 904 and 908 may be included in a light fixture power circuit such as described and shown, for example in FIG. 7, above.

Tester 900 may include frame 912. Frame 912 may support tracks 913. Tracks 913 may guide and support edges 914 of light fixture 902. Light fixture 902 may be moved, either by a person or by conveyance apparatus, in direction B along tracks 913 until light fixture 902 is properly positioned for testing in tester 900.

Tester 900 may include test head deployment assemblies 916 and 918 for engaging lamp holders 904 and 908, respectively. Test head deployment assemblies 916 and 918 may support test heads that mechanically and electrically interact with lamp holders 904 and 908 in the manners shown and described above. Test head deployment assemblies 916 and 918 may deploy test heads such as 300 (shown in FIG. 3). Test head deployment assemblies 916 and 918 may deploy the test heads to a test station (not shown; see element 1014 in FIG. 10), upon the proper positioning of light fixture 902. Test head deployment assemblies 916 and 918 may then perform a light fixture power circuit test. Test head deployment assemblies 916 and 918 may then return the test heads to stand-by station 920 to provide clearance for the removal of light fixture 902 and the positioning of another light fixture (not shown).

When tester 900 is used in conjunction with a linear testing or assembly line that conveys light fixtures to tester 900, test head deployment assemblies 916 and 918 may be positioned at different locations on the linear testing or assembly line. For example, test head deployment assemblies 916 and 918 may be positioned at different locations along the length of a track, conveyor apparatus or roller assembly. In some embodiments, test head deployment assemblies 916 and 918 may reciprocate in a direction, such as direction B, that is parallel to the linear testing line.

In some embodiments of the invention, the actions involved in testing a light fixture may be automated. For example, a conveyor (not shown) may deliver light fixture 902 to tester 900. The conveyor, or other suitable apparatus, may align light fixture 902 with tracks 913. The conveyor or other suitable apparatus may slide light fixture 902 along tracks 913 until lamp holders 904 and 908 are in position for testing.

Figure 9A:
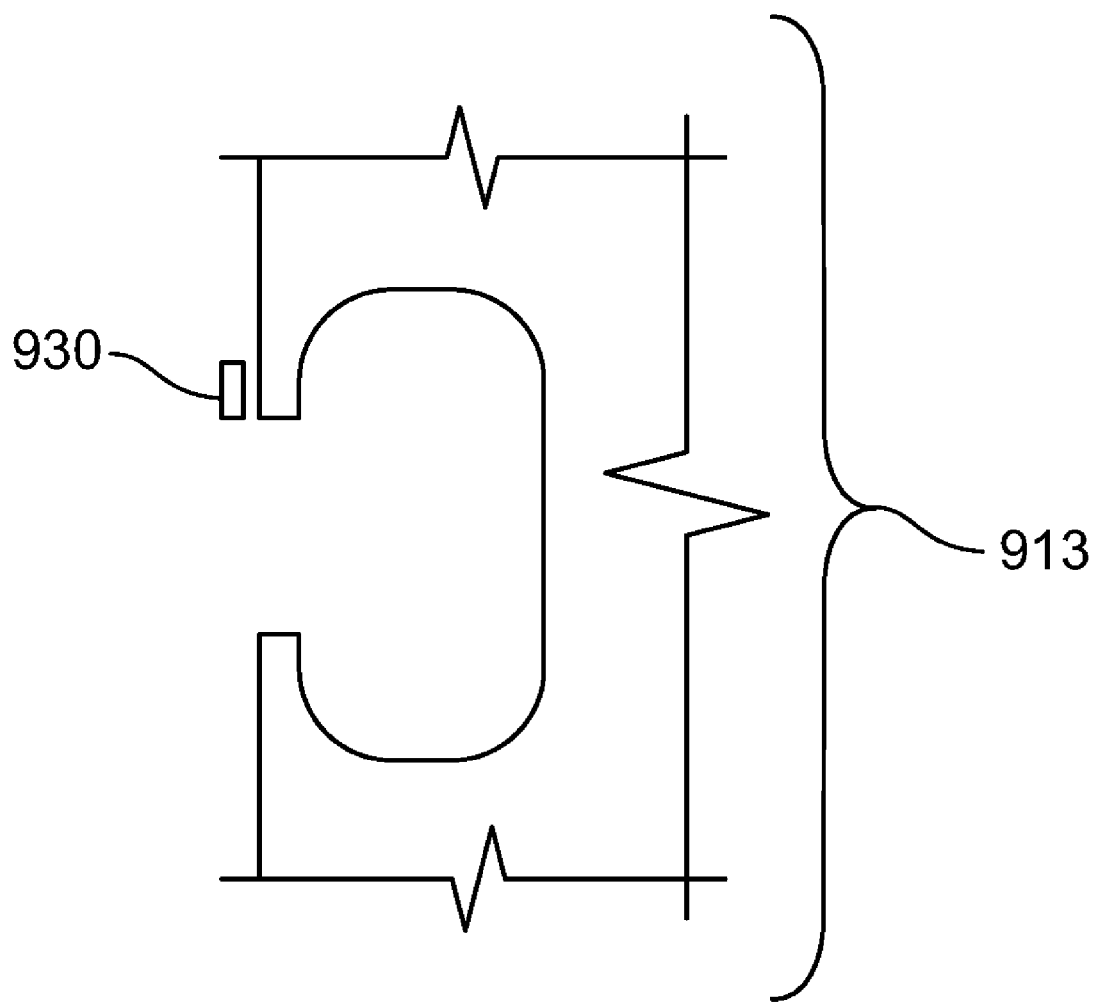
FIG. 9A shows a portion of the apparatus shown in FIG. 9 along with a sensor.

FIG. 9A shows sensor 930 and track 913. Sensor 930 may detect the presence of light fixture 902 or lamp holders 904 and 908. Any suitable sensor may be used to detect the presence and/or position of light fixture 902 or lamp holders 904 and 908. The sensor may trigger a hardware and/or software-based control process that cause test head deployment assemblies 916 and 918 to move their corresponding test heads to corresponding test stations, at which the lamp holders may be engaged. The control process may then activate the test circuit.

The control process may then cause the test circuit to conduct, process, and evaluate a test measurement. The control process may cause a result from the test measurement or an evaluation of the result to be displayed on a display (not shown). The control process may store test results. The control process may store identification information so that the test results can be correlated with the light fixture under test.

The control process may then retract the test heads. The control process may cause the light fixture to be conveyed away from tester 900. The control process may cause a different light fixture to be delivered to and installed in tester 900.

Figure 10:
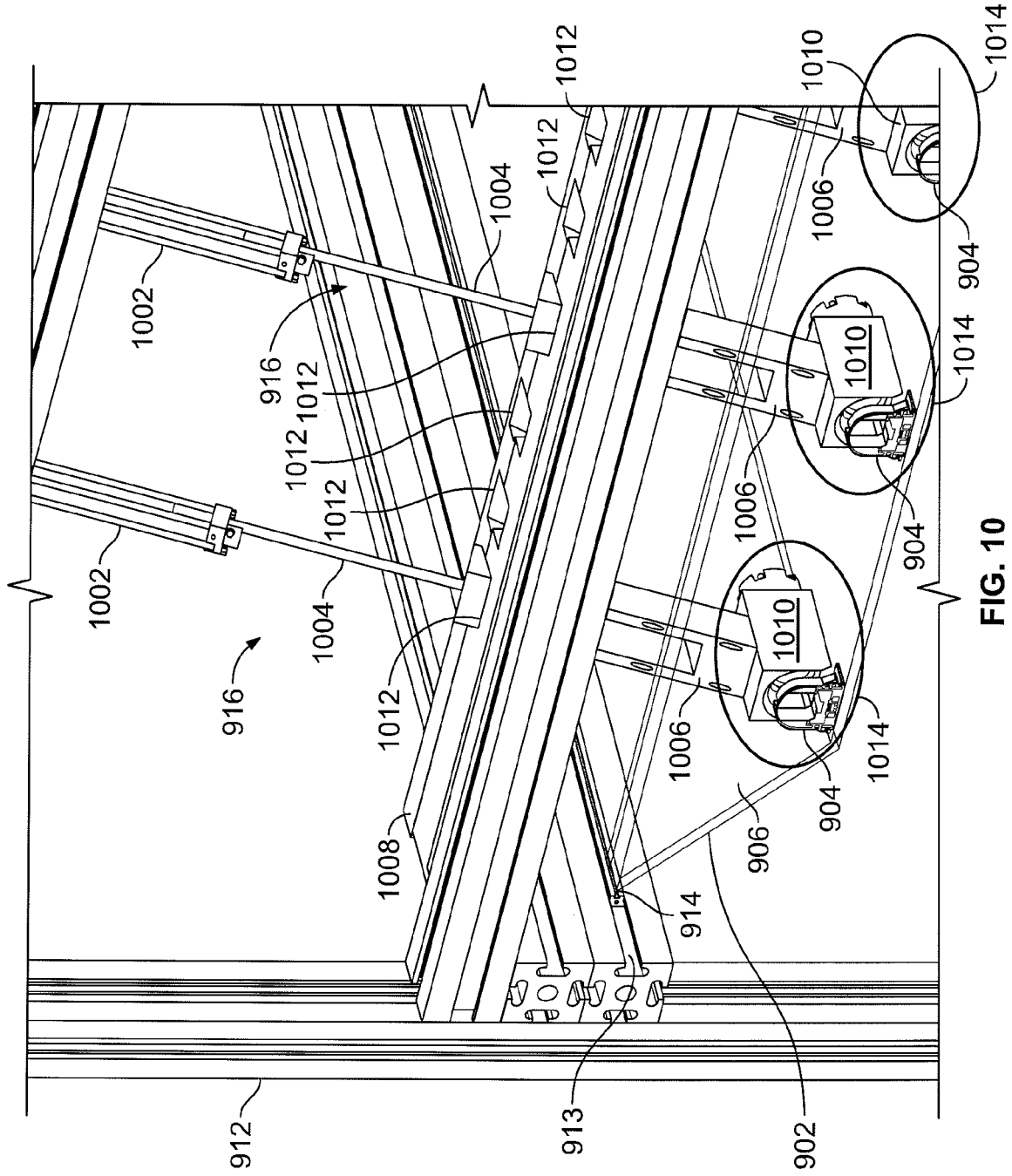
FIG. 10 shows a portion of the apparatus shown in FIG. 9 at a process stage that is different from the stage shown in FIG. 9.

FIG. 10 shows area 10 of FIG. 9 in more detail when light fixture 902 is fully inserted in tester 900. Edge 914 is supported by track 913. In FIG. 10, panel 906 has been made transparent to show lamp holders 904 and the bottom portions of test head deployment assemblies 916. Test head deployment assemblies may include linear displacement devices 1002 that actuate pistons 1004. Pistons 1004 may control the positions of test head control arms 1006. Test head control arms 1006 may be guided by control arm guide 1008. Test heads 1010 are supported by test head control arms 1006. By raising and lowering test head control arms 1006, test heads 1010 may be moved between test station 1014 and stand-by station (920, shown in FIG. 9). At test station 1014, test heads 1010 may engage lamp holders 904. At stand-by station 920, test heads 1010 are away from light fixture 902 so that light fixture 902 may be removed from tester 902.

It is noted that control arm guide 1008 includes numerous control channels 1012. In tester 900, as illustrated in FIGS. 9 and 10, only three of control channels are in use. This illustrates that tester 900 may be configured for testing different light fixture models that have different lamp holder numbers and positions.

Figure 11:
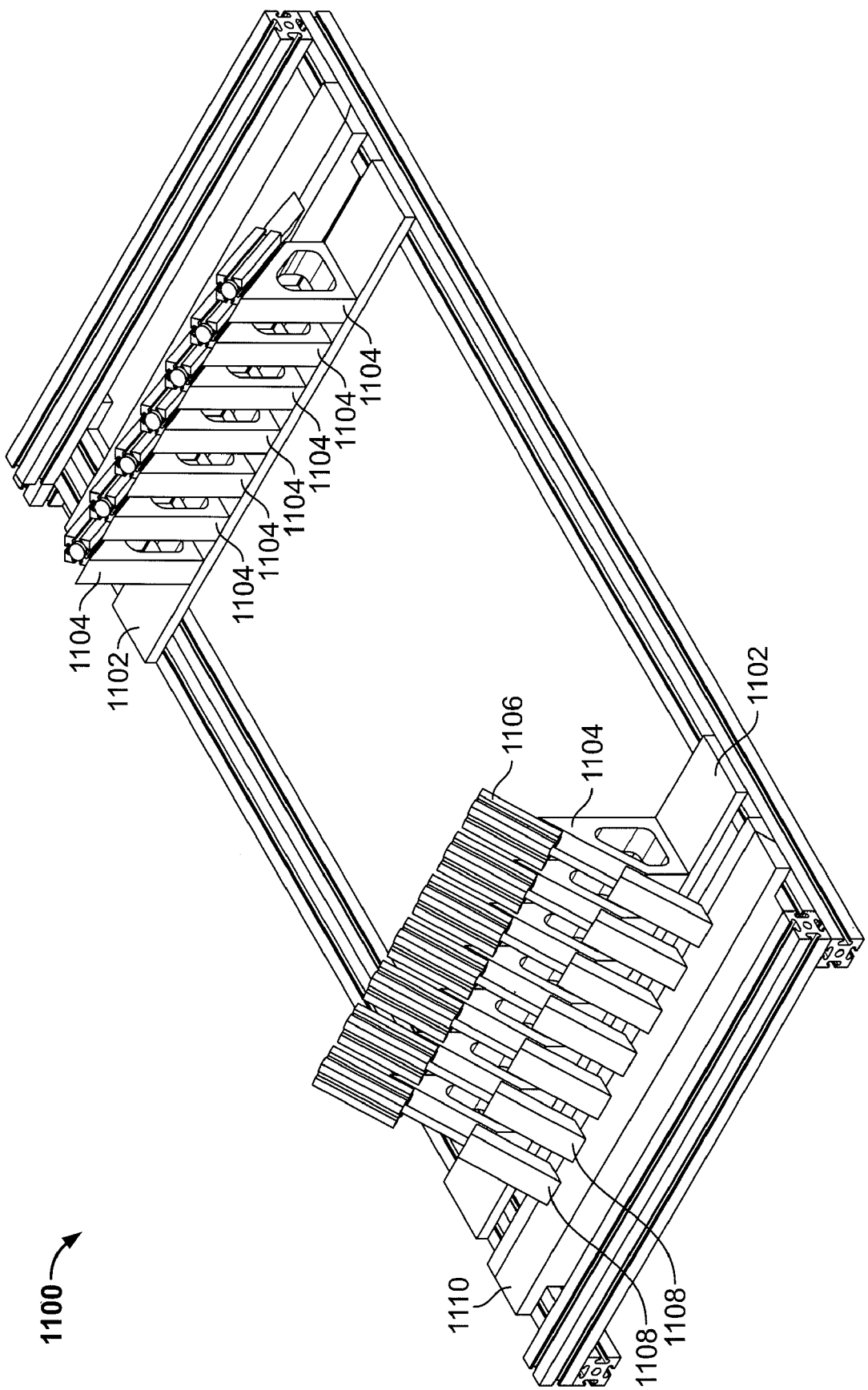
FIG. 11 is still another apparatus in accordance with the principles of the invention.

FIG. 11 shows illustrative test platform 1100. Test platform 1100 may be used in conjunction with a tester such as 900 (shown in FIG. 9). Test platform 1100 may be supported by a frame such as frame 912 (shown in FIG. 9). Test platform 1100 may include transverse supports 1102. Each of transverse supports 1102 may support one or more structures 1104 for supporting a linear displacement device 1106. (For the sake of clarity, not all like elements of FIG. 11 are identified with reference numerals.) Each linear displacement device 1106 may control the position of a control arm 1108. Control arms 1108 may reciprocate through control channels in control arm guide 1110.

Figure 12:
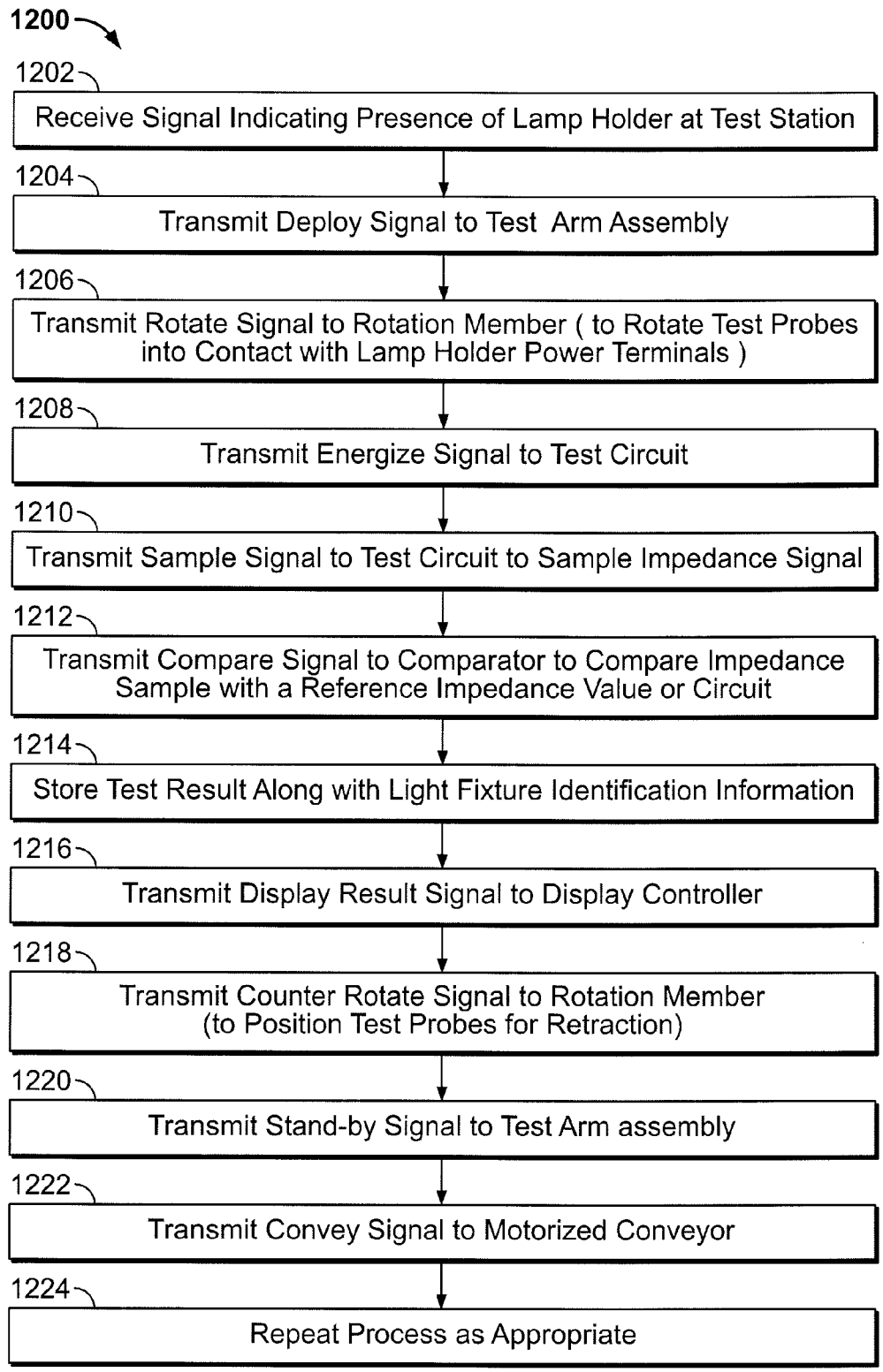
FIG. 12 is a flow diagram showing an illustrative process in accordance with the principles of the invention.

FIG. 12 shows illustrative process 1200. Illustrative process 1200 may be executed by a programmable logic controller ("PLC") or any other suitable microprocessor or computer system. The PLC may used in conjunction with some or all of the light fixtures and test apparatus shown in FIGS. 1-11.

At step 1202 of process 1200, the PLC may receive from a sensor a signal indicating presence of lamp holder at a test station of a test apparatus. At step 1204, the PLC may transmit deploy signal to a test arm assembly to engage the test arm assembly with the lamp holder. At step 1206, the PLC may transmit a rotate signal to a rotation member to rotate test probes into contact with lamp holder power terminals. At step 1208, the PLC may transmit an energize signal to a test circuit to initiate a continuity or an impedance test. At step 1210, the PLC may transmit a sample signal to the test circuit to initiate the sampling of impedance of the light fixture power circuit. At step 1212, the PLC may transmit a compare signal to a comparison circuit. The compare signal may cause the comparison circuit to compare a test impedance sample with a reference impedance value or circuit. At step 1214, the PLC may store a test result along with light fixture identification information. At step 1216, the PLC may transmit a display result signal to a display controller. The display controller may access the test result from a memory register. At step 1218, the PLC may transmit a counter-rotate signal to the rotation member to position the test probes for retraction from the lamp holder. At step 1220, the PLC may transmit a stand-by signal to the test arm assembly. The stand-by signal may cause the test arm assembly to move one or more test heads from the area of the light fixture. At step 1222, the PLC may transmit a convey signal to a motorized conveyor. The motorized conveyor may remove a tested light fixture from the test apparatus. The motorized conveyor may deliver an untested light fixture to the test apparatus. At step 1224, process 1200 may repeat, starting at step 1202, if untested conveyors are to be tested.

Figure 13A:
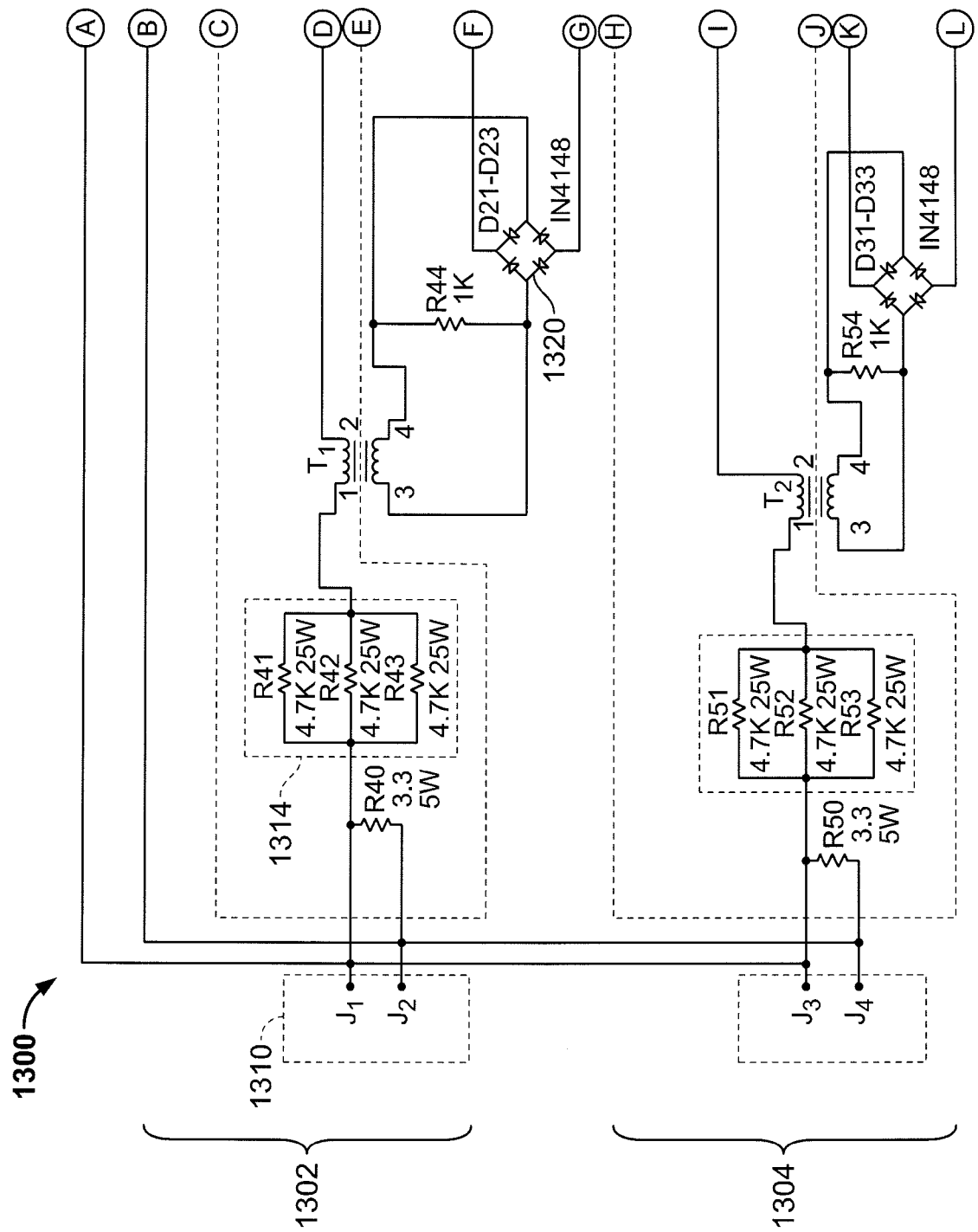
FIGS. 13A and B show a diagram of a circuit in accordance with the principles of invention.
Figure 13B:
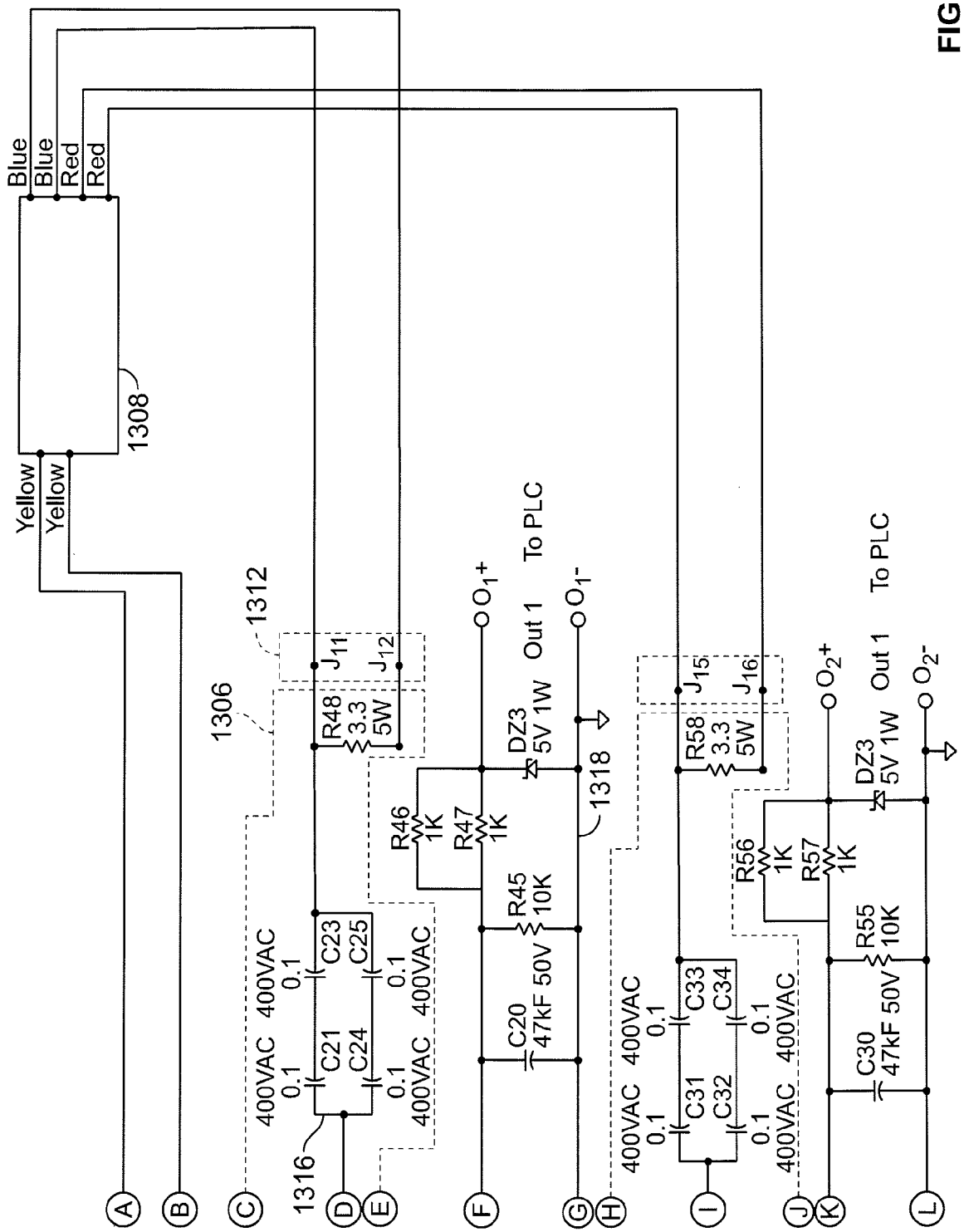

FIGS. 13A and 13B show illustrative impedance testing circuit 1300. Circuit 1300 may include test circuits 1302 and 1304. Each of circuits 1302 and 1304 may be used to test the wiring of a pair of lamp holders. For example, test circuits 1302 and 1304 may be used to test the wiring of lamp holders 104 and 110 (shown in FIG. 1 at opposite ends of arrow A) and 106 and 112 (at opposite ends of arrow B), respectively. An impedance testing circuit such as 1300 may be configured to test the wiring of one, two, three, four or any suitable number of lamp holder pairs.

As illustrated in FIGS. 13A and 13B, test circuits 1302 and 1304 may be identical, so the they will be described with respect to test circuit 1302 only. Excitation circuit 1306 may include probes 1310 and 1312. Probes 1310 and 1312 may be inserted into lamp holders such as 104 and 110, respectively, using testing apparatus shown and described herein. Excitation circuit 1306 simulates the impedance of a fluorescent tube based on effective resistance 1314 and effective capacitance 1316. Different fluorescent tubes may be simulated by appropriately changing the effective resistance and capacitance of excitation circuit 1306. Excitation circuit 1306 may be excited with an alternating current that is output by ballast 1308. Different ballasts may be used as appropriate to match or simulate the light fixture wiring under test.

Transformer T1 provides an alternating current at low voltage to impedance measurement circuit 1318. The high-voltage side of T1 (at excitation circuit 1306) has impedance characteristics that are based on excitation circuit 1306 and the wiring (not shown in FIG. 13A or 13B) that connects the lamp holders under test. The low voltage alternating current is rectified at rectifier 1320 and conditioned for output to a PLC, as described above. The output may be provided at terminals O1− and O1+. The low voltage rectified signal may then be compared by the PLC to a reference signal. The comparison may be a direct comparison. The comparison may be a comparison based on measured or calculated characteristics of the light fixture wiring under test and the reference signal. If the low voltage rectified signal compares favorably with the reference signal, the PCL may indicate that the lamp holders under test are correctly wired.

Thus, apparatus and methods for testing a light fixture power circuit have been provided. Aspects of the invention have been described in terms of illustrative embodiments thereof. A person having ordinary skill in the art will appreciate that numerous additional embodiments, modifications, and variations may exist that remain within the scope and spirit of the appended claims. For example, one of ordinary skill in the art will appreciate that the steps illustrated in the figures may be performed in other than the recited order and that one or more steps illustrated may be optional. The methods and systems of the above-referenced embodiments may also include other additional elements, steps, computer-executable instructions, or computer-readable data structures. In this regard, other embodiments are disclosed herein as well that can be partially or wholly implemented on a computer-readable medium, for example, by storing computer-executable instructions or modules or by utilizing computer-readable data structures.

The embodiments shown and described above are presented for purposes of illustration rather than of limitation. The present invention is limited only by the claims that follow.

What is claimed is:

1. A method for testing a light fixture power circuit, the method comprising:
    seating a portion of a fluorescent lamp holder in a test nest of a test head:
    moving first and second probes into contact with first and second power terminals in the fluorescent lamp holder that is in electrical communication with the light fixture power circuit;
    receiving a signal that corresponds to an electrical characteristic of the light fixture power circuit; and
    transmitting to an output device an output signal that corresponds to the electrical characteristic.

2. The method of claim 1 wherein:
    the receiving comprises receiving a signal that corresponds to an impedance of the light fixture power circuit; and
    the transmitting comprises transmitting to an output device an output signal that corresponds to the impedance.

3. The method of claim 1 wherein:
    the receiving comprises receiving a signal that corresponds to a resistance of the light fixture power circuit; and
    the transmitting comprises transmitting to an output device an output signal that corresponds to the resistance.

4. The method of claim 1 wherein the engaging comprises manipulating a lamp holder support to which at least two lamp holders are attached.

5. The method of claim 1 wherein the engaging comprises:
    positioning the fluorescent lamp holder at a test station; and
    deploying the test head affixed to a reciprocating test head deployment assembly so that the test nest of the test head receives a portion of the fluorescent lamp holder.

6. The method of claim 5 wherein the engaging further comprises detecting a presence of the lamp holder at the test station.

7. The method of claim 6 wherein the detecting a presence of a lamp holder comprises receiving a signal from a mechanical sensor that is configured to sense the presence of the lamp holder.

8. The method of claim 6 wherein the detecting a presence of a lamp holder comprises receiving a signal from an optical sensor that is configured to sense the presence of the lamp holder.

9. The method of claim 6 wherein the detecting a presence of a lamp holder comprises receiving a signal from a capacitance sensor that is configured to sense the presence of the lamp holder.

10. The method of claim 4 wherein the engaging further comprises transmitting a deployment instruction to the reciprocating arm assembly, the transmitting being triggered by a lamp holder detection signal.

11. The method of claim 1 further comprising transmitting a test result indicator to the output device.

12. The method of claim 11 further comprising:
    receiving a test result from a comparison circuit; and
    after receiving the test result from the comparison circuit, transmitting a conveyance signal to a conveyor motor, the conveyance signal triggering the motor to move a light fixture.

13. The method of claim 11 wherein the transmitting a test result indicator comprises transmitting the indicator to a data port.

14. The method of claim 11 wherein the transmitting a test result indicator comprises transmitting the indicator to a wireless interface.

15. The method of claim 11 wherein the transmitting a test result indicator comprises transmitting the indicator to a display.

16. The method of claim 1 further comprising:
    supporting the test head with a frame; and
    arranging the frame at a position on a light fixture assembly line.

17. The method of claim 4 wherein the manipulating comprises manually manipulating the lamp holder support.

* * * * *